United States Patent
Miao et al.

(10) Patent No.: US 9,543,955 B2
(45) Date of Patent: Jan. 10, 2017

(54) NON-VOLATILE LOGIC DEVICE BASED ON PHASE-CHANGE MAGNETIC MATERIALS AND LOGIC OPERATION METHOD THEREOF

(71) Applicant: Huazhong University of Science and Technology, Wuhan (CN)

(72) Inventors: Xiangshui Miao, Wuhan (CN); Yi Li, Wuhan (CN); Yingpeng Zhong, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 14/849,621

(22) Filed: Sep. 10, 2015

(65) Prior Publication Data

US 2015/0381181 A1 Dec. 31, 2015

Related U.S. Application Data

(63) Continuation-in-part of application No. PCT/CN2014/076115, filed on Apr. 24, 2014.

(30) Foreign Application Priority Data

Jan. 27, 2014 (CN) .......................... 2014 1 0039670

(51) Int. Cl.
*H03K 19/08* (2006.01)
*G11C 11/16* (2006.01)
(Continued)

(52) U.S. Cl.
CPC ................. *H03K 19/08* (2013.01); *G11B 5/02* (2013.01); *G11C 11/16* (2013.01); *G11C 11/161* (2013.01);
(Continued)

(58) Field of Classification Search
None
See application file for complete search history.

(56) References Cited

U.S. PATENT DOCUMENTS

3,780,312 A * 12/1973 Lin ...................... H03K 19/168
365/42
5,515,314 A * 5/1996 Kouhei .................. G11C 11/14
365/157
(Continued)

*Primary Examiner* — Crystal L Hammond
(74) *Attorney, Agent, or Firm* — Matthias Scholl, PC; Matthias Scholl (57) ABSTRACT

A non-volatile logic device, including: a substrate, a magnetic head, a base electrode, an insulating layer, a phase-change magnetic film, and a top electrode. The substrate includes a silicon substrate and an active layer attached to the silicon substrate. The base electrode includes an N-type silicon layer, a P-type silicon layer and a heating layer, the N-type silicon layer and the P-type silicon layer constitute a PN diode structure, and the size of the heating layer is smaller than that of the P-type silicon layer. The phase-change magnetic film is deposited on the insulating layer and is electrically contacted with the heating layer. The top electrode and the base electrode are connected to an external electrical pulse signal, and an external magnetic field parallel to a two dimensional plane of the phase-change magnetic film is applied to the non-volatile logic device.

6 Claims, 6 Drawing Sheets

(51) Int. Cl.
  *G11C 13/00* (2006.01)
  *H03K 19/177* (2006.01)
  *G11B 5/02* (2006.01)
  *H03K 19/18* (2006.01)

(52) U.S. Cl.
  CPC ....... *G11C 11/1673* (2013.01); *G11C 13/0004* (2013.01); *G11C 13/004* (2013.01); *G11C 13/0097* (2013.01); *H03K 19/1776* (2013.01); *H03K 19/18* (2013.01)

(56) References Cited

U.S. PATENT DOCUMENTS

| | | | | |
|---|---|---|---|---|
| 5,596,555 A * | 1/1997 | Osato | ............... | G11B 11/10506 360/59 |
| 6,178,112 B1 * | 1/2001 | Bessho | ................... | G11C 11/22 257/E43.004 |
| 6,291,993 B1 * | 9/2001 | Fert | ........................ | B82Y 10/00 324/252 |
| 6,898,156 B1 * | 5/2005 | Nakamiya | ............. | G04C 10/00 320/135 |
| 7,388,574 B2 * | 6/2008 | Takatsuka | ............. | G05G 9/047 345/156 |
| 7,825,658 B2 * | 11/2010 | Koga | ..................... | B82Y 25/00 324/252 |
| 9,159,360 B2 * | 10/2015 | Shiroishi | ............ | G11B 20/1217 |
| 2006/0028247 A1 * | 2/2006 | Hara | ....................... | G11C 11/22 326/104 |
| 2006/0176620 A1 * | 8/2006 | Ravelosona | ........... | G11B 5/193 360/324.2 |
| 2006/0284214 A1 * | 12/2006 | Chen | .................... | H01L 27/2436 257/213 |
| 2007/0131922 A1 * | 6/2007 | Lung | ................... | H01L 27/2436 257/5 |
| 2008/0007995 A1 * | 1/2008 | Schwerin | ........... | G11C 13/0004 365/163 |
| 2008/0314739 A1 * | 12/2008 | Gopalakrishnan | .. | C23C 18/1204 204/247.4 |
| 2009/0243653 A1 * | 10/2009 | Inokuchi | ................ | G11C 11/16 326/49 |
| 2010/0039136 A1 * | 2/2010 | Chua-Eoan | ............. | G11C 11/16 326/38 |
| 2010/0073025 A1 * | 3/2010 | Tanamoto | .......... | H03K 19/1776 326/41 |
| 2012/0300541 A1 * | 11/2012 | Higo | ....................... | G11C 11/16 365/171 |
| 2013/0001502 A1 * | 1/2013 | Jung | ...................... | H01L 45/06 257/4 |
| 2015/0084972 A1 * | 3/2015 | Wu | ...................... | G09G 3/2096 345/520 |

* cited by examiner

NON-VOLATILE LOGIC DEVICE BASED ON PHASE-CHANGE MAGNETIC MATERIALS AND LOGIC OPERATION METHOD THEREOF

CROSS-REFERENCE TO RELATED APPLICATIONS

This application is a continuation-in-part of International Patent Application No. PCT/CN2014/076115 with an international filing date of Apr. 24, 2014, designating the United States, now pending, and further claims priority benefits to Chinese Patent Application No. 201410039670.4 field Jan. 27, 2014. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

Field of the Invention

The invention relates to a non-volatile logic device based on phase-change magnetic materials and a logic operation method thereof.

Description of the Related Art

Phase-change magnetic material is adapted to rapidly and reversibly change its structure and spin. When a phase-change magnetic material changes from a crystalline state to an amorphous state, or vice versa, the optical, electrical, and magnetic properties thereof alter accordingly. The phenomenon can be used for adjusting the magnetic properties of the material as well as for preparing novel spintronic devices for information storage and logic operation. However, so far, no design and manufacturing regarding to spintronic devices are disclosed.

SUMMARY OF THE INVENTION

In view of the above-mentioned problems, it is an objective of the invention to provide a logic device being able to achieve logic operation and non-volatile information storage simultaneously based on phase-change magnetic materials.

To achieve the above objective, according to one embodiment of the invention, there is provided a non-volatile logic device based on phase-change magnetic materials. The phase-change magnetic material is formed by doping a phase-change material with ferromagnetic elements, and magnetism of the material can be regulated reversibly by amorphous state-crystalline state phase change.

The invention provides a non-volatile logic device based on phase-change magnetic materials, comprising: a substrate, a magnetic head, a base electrode, an insulating layer, a phase-change magnetic film, and a top electrode, wherein the base electrode, the insulating layer, the phase-change magnetic film and the top electrode are sequentially attached to the substrate, and the substrate comprises a silicon substrate and an active layer attached to the silicon substrate.

The base electrode comprises an N-type silicon layer, a P-type silicon layer and a heating layer, the N-type silicon layer and the P-type silicon layer constitute a PN diode structure, and size of the heating layer is smaller than that of the P-type silicon layer; the phase-change magnetic film is deposited on the insulating layer and is electrically contacted with the heating layer; both the top electrode and the base electrode are connected to an external electrical pulse signal, and an external magnetic field parallel to the two dimensional plane of the phase-change magnetic film is applied to the non-volatile logic device, the magnetic field being uniform and variable, and having an intensity of 0-12000 Oe; the magnetic head is operable for detecting a magnetic state of the phase-change magnetic material, and comprises a base, and a first magnetic shield layer, a magnetoresistive sensor and a second magnetic shield layer sequentially attached to the base; and the first magnetic shield layer and the second magnetic shield layer are operable for shielding magnetic state of surrounding devices' interference with the magnetoresistive sensor, and the magnetoresistive sensor is operable for detecting residual magnetization of the phase-change magnetic material and converting the residual magnetization to a read current for outputting.

In a class of this embodiment, the phase-change magnetic film is formed by doping a phase-change material with ferromagnetic elements, and is expressed by $A_xB_{1-x}$, where A is ferromagnetic element, B is phase-change material, and $0<x\leq 30\%$.

In a class of this embodiment, phase-change material B is one of the binary, ternary and quaternary chalcogenides including Ge—Te, Sb—Te, Bi—Te, Ge—Sb, Sn—Te, Sb—Se, In—Se, Ge—Sb—Te, In—Sb—Te, As—Sb—Te, Sn—Sb—Te, Ge—Te—Sn, Sb—Se—Bi, Ga—Te—Se, Ge—Te—Ti, Ge—Te—Sn—O, Ge—Te—Sn—Ag, Ag—In—Sb—Te and alloys thereof.

In a class of this embodiment, the phase-change magnetic film is $Ge_2Sb_2Te_5$, $Ge_1Sb_2Te_4$, $Ge_1Sb_4Te_7$, GeTe, GeSb, $Sb_2Te_3$, $Sb_{70}Te_{30}$, $Ag_5In_5Sb_{60}Te_{30}$, $Bi_2Te_3$ or $Sb_2Se_3$, and the ferromagnetic element A is but not limited to one of Co, Fe, Ni, alloys thereof such as FePt, CoPt, CoFeB, TbFeCo, CoCrPtB and CoCrPtTa, Mn, Cr and rare earth elements Gd, Tb, Dy, Ho, Er and Tm.

In a class of this embodiment, the phase-change magnetic film is $Fe_{0.02}Ge_{0.98}Te$, $Fe_{0.08}Ge_{0.92}Te$, $Fe_{0.14}Ge_{0.86}Te$ or $Fe_{0.25}Ge_{0.75}Te$.

The logic device of the invention has a plurality of non-volatile physical states. Phase structure, electrical property, optical property and magnetic property of a phase-change magnetic material at amorphous state are different with that of the phase-change magnetic material at crystalline state, which can be used for information storage. The invention uses an external electrical pulse and an external magnetic field as logic inputs for logic operation, and uses a physical quantity of magnetic property, residual magnetization of the device, to represent result of logic operation, which can be stored in magnetic state of the device non-volatilely. Information is read out by a magnetic head detecting the magnetic state, and is erased by applying a coercive field or an electrical pulse causing amorphization of the phase-change magnetic material. Besides, the device can carry out a plurality of logic operations such as implication logic and Boolean logics including OR, NOR, AND and NAND under different definitions of logic 0 and logic 1, so as to facilitate design of non-volatile logic devices greatly.

The invention provides a non-volatile logic operation method, comprising: applying an electrical pulse signal to a top electrode and an active layer of a non-volatile logic device and applying a magnetic field to the non-volatile logic device; and carrying out logic operation by using the electrical pulse signal as a logic input Input A, using the magnetic field as another logic input Input B, and using residual magnetization $B_r$ of a phase-change magnetic material of the non-volatile logic device as logic output Output.

In a class of this embodiment, for the logic input Input A, an electrical pulse signal SET is defined as logic 1, and an electrical pulse signal RESET is defined as logic 0; for the logic input Input B, a weak magnetic field of 0-500 Oe is defined as logic 1, and a strong magnetic field of 2500 Oe-10000 Oe is defined as logic 0; and for logic output Output, comparatively strong magnetization $B_r$ of 2.5 emu/cc-20 emu/cc is defined as logic output 0, and comparatively weak magnetization $B_r$ of 0-1 emu/cc is defined as logic output 1, so as to achieve implication logic operation.

In a class of this embodiment, for the logic input Input A, an electrical pulse signal SET is defined as logic 0, and an electrical pulse signal RESET is defined as logic 1; for the logic input Input B, a weak magnetic field of 0-500 Oe is defined as logic 1, and a strong magnetic field of 2500 Oe-10000 Oe is defined as logic 0; and for logic output Output, comparatively strong magnetization $B_r$ of 2.5 emu/cc-20 emu/cc is defined as logic output 0, and comparatively weak magnetization $B_r$ of 0-1 emu/cc is defined as logic output 1, so as to achieve Boolean logic OR operation.

In a class of this embodiment, for the logic input Input A, an electrical pulse signal SET is defined as logic 0, and an electrical pulse signal RESET is defined as logic 1; for the logic input Input B, a weak magnetic field of 0-500 Oe is defined as logic 1, and a strong magnetic field of 2500 Oe-10000 Oe is defined as logic 0; and for logic output Output, comparatively strong magnetization $B_r$ of 2.5 emu/cc-20 emu/cc is defined as logic output 1, and comparatively weak magnetization $B_r$ of 0-1 emu/cc is defined as logic output 0, so as to achieve Boolean logic NOR operation.

In a class of this embodiment, for the logic input Input A, an electrical pulse signal SET is defined as logic 1, and an electrical pulse signal RESET is defined as logic 0; for the logic input Input B, a weak magnetic field of 0-500 Oe is defined as logic 0, and a strong magnetic field of 2500 Oe-10000 Oe is defined as logic 1; and for logic output Output, comparatively strong magnetization $B_r$ of 2.5 emu/cc-20 emu/cc is defined as logic output 1, and comparatively weak magnetization $B_r$ of 0-1 emu/cc is defined as logic output 0, so as to achieve Boolean logic AND operation.

In a class of this embodiment, for the logic input Input A, an electrical pulse signal SET is defined as logic 1, and an electrical pulse signal RESET is defined as logic 0; for the logic input Input B, a weak magnetic field of 0-500 Oe is defined as logic 0, and a strong magnetic field of 2500 Oe-10000 Oe is defined as logic 1; and for logic output Output, comparatively strong magnetization $B_r$ of 2.5 emu/cc-20 emu/cc is defined as logic output 0, and comparatively weak magnetization $B_r$ of 0-1 emu/cc is defined as logic output 1, so as to achieve Boolean logic NAND operation.

The invention still provides a reading and erasing method for logic operation results, comprising: storing logic operation results in non-volatile residual magnetic state of a phase-change magnetic material; detecting residual magnetization of the phase-change magnetic material and converting the residual magnetization to a read current for outputting by a magnetic head; and applying a reverse coercive field Hc or a pulse RESET to cause amorphization of the phase-change magnetic material to erase the stored information.

The invention achieves implication logic operation and four Boolean logic operations including OR, NOR, AND and NAND based on phase-change controlled magnetism of the material, computation results thereof are stored in the device as residual magnetization of the material, so as to carry out information storage and processing simultaneously in a single logic device. The logic device of the invention is expected to be used to constitute the next generation of new computer architecture combining information storage with information processing, so as to break through the bottleneck of Von Neumann in conventional computer architecture caused by separation of information storage and information processing. The logic device of the invention is applicable in the fields of solid state memories, logic operators, programmable gate arrays and systems on chips as a basic element.

DETAILED DESCRIPTION OF THE INVENTION

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

In view of the above-mentioned problems, it is an objective of the invention to provide a non-volatile logic device based on phase-change magnetic materials and a logic operation method thereof. The invention can carry out implication logic, AND logic, OR logic, NAND logic and NOR logic, so as to combine information storage with information processing.

Compared with prior art, based on the fact that magnetism of a phase-change material changes with crystalline state-amorphous state phase change synchronously and non-volatilely, the invention carries out implication logic and Boolean logics including OR, NOR, AND and NAND in a signal device, computation results thereof are stored in the device as residual magnetization of the material, so as to carry out information storage and processing simultaneously in a single logic device, which is expected to be used to constitute the next generation of new computer architecture combining information storage with information processing, so as to break through the bottleneck of Von Neumann in conventional computer architecture caused by separation of information storage and information processing.

Accompanying drawings of exemplary embodiments of the invention are provided for reference and for full illustration of the invention. However, it should be noted that the invention can be carried out in many different ways and is not limited to the embodiments herein. More specifically, the embodiments are provided for full disclosure of the invention and for better understanding of the invention for those skilled in the art.

In the invention, as core of the logic device, the phase-change magnetic material experiences reversible phase change under the effect of Joule heat caused by current. A pulse SET with medium intensity and comparatively large pulse width has temperature of the phase-change magnetic material increase to above its crystallization temperature $T_c$, which results in phase transition from amorphous state of high impedance to crystalline state of low impedance. A pulse RESET with comparatively high intensity and small pulse width has temperature of the phase-change magnetic material increase to above its melting temperature $T_m$, which results in phase transition from crystalline state of low impedance to amorphous state of high impedance.

Reversible phase transition of the phase-change magnetic material between amorphous state and crystalline state is accompanied with magnetism change of the material. As carrier concentration is not high enough to form long-range ferromagnetic exchange force, the phase-change magnetic material at amorphous state generates magnetic moments macroscopically based on localized short-range ferromagnetic exchange force, while ferromagnetism of the phase-change magnetic material at crystalline state comes from long-range ferromagnetic exchange force regulated by massive free carriers in the material. In other words, long-range and short-range change in structure coincides with that in ferromagnetic exchange force. Therefore, magnetism of the phase-change magnetic material can be adjusted by phase change in its structure. Both non-volatile impedance state and magnetic state of the material can be used to represent logic 0 and logic 1 for information storage and processing.

Figure 1:
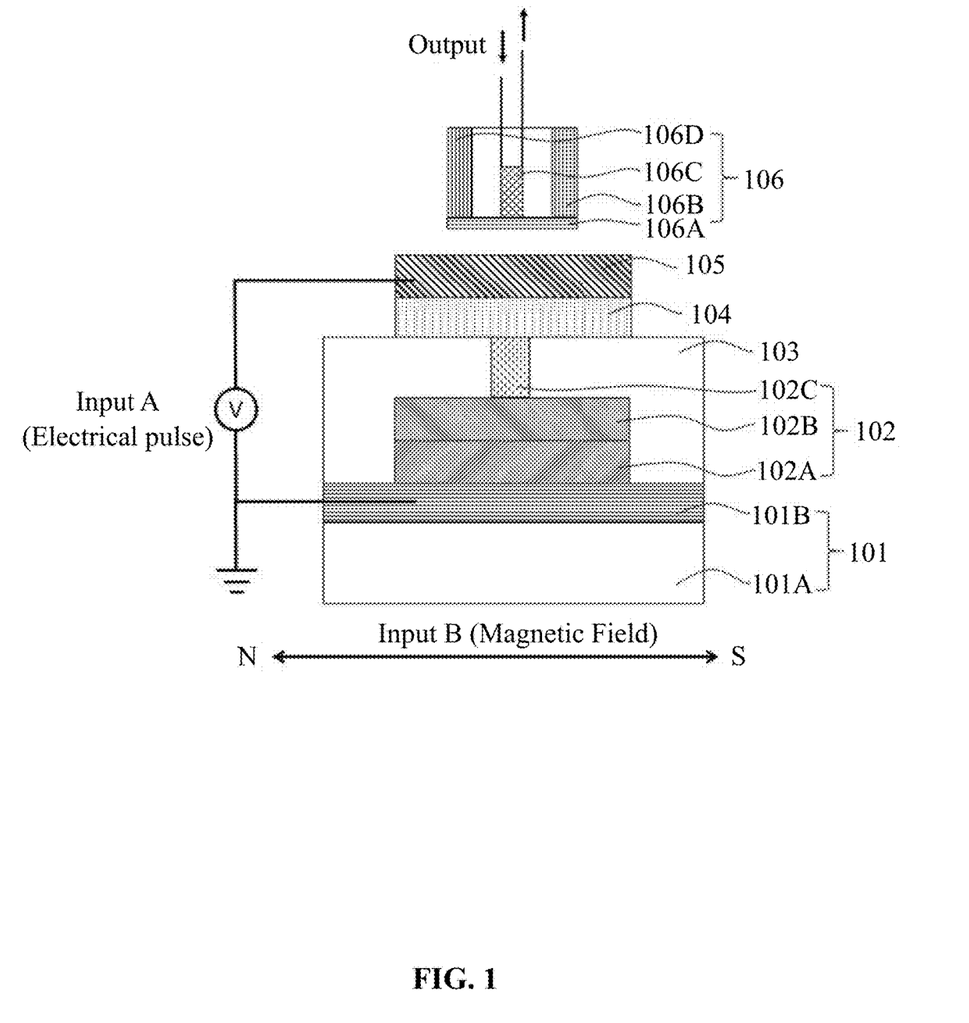
FIG. 1 is a schematic diagram of a logic device based on phase-change magnetic materials according to one embodiment of the invention.

FIG. 1 is a schematic diagram of a logic device based on phase-change magnetic materials according to one embodiment of the invention. Referring to FIG. 1, the logic device comprises a substrate 101, a base electrode 102, an insulating layer 103, a phase-change magnetic film 104, a top electrode 105 and a magnetic head 106. Specifically, substrate 101 is formed by a silicon substrate 101A and an active layer 101B thereon, which can be produced by doping the silicon substrate. For example, an N-type active layer is produced by doping the silicon substrate with P or As, and a P-type active layer is produced by doping the silicon substrate with B, which can reduce potential barrier between the active layer 101B and the base electrode 102 to improve conductivity therebetween and therefore is used as a word line or a bit line in massive array integration. The base electrode 102 is deposited on the substrate 101 and is formed by an N-type silicon layer 102A, a P-type silicon layer 102B and a heating layer 102C. The N-type silicon layer 102A and the P-type silicon layer 102B constitute a PN diode structure, which can be used as a gated transistor connected to a word line or a bit line in massive array integration so as to gate specific devices for operation under an applied voltage. Size of the N-type silicon layer 102A equals that of the P-type silicon layer 102B, and size of the heating layer 102C is smaller than that of the P-type silicon layer 102B. The base electrode 102 is covered by the insulating layer 103 to be insulated from other devices. The insulating layer 103 may be $SiO_2$, $Si_3N_4$ or SiON. The phase-change magnetic film 104 is deposited on the insulating layer 103 and is electrically connected to the heating layer 102C. To concentrate electro-induced Joule heat generated by the heating layer 102C for better effect of electro-induced phase change under low power consumption, size of the heating layer 102C could be reduced, and a minimum size thereof is determined by feature size of lithography. The top electrode 105 is deposited on the phase-change magnetic film 104. The heating layer 102C and the top electrode 105, respectively, may be a metal or a metal compound with good conductivity, such as Ti, Cu, Al, Ta, TiN, TiW, TaN or TiAlN. The top electrode 105 and the base electrode 102 are connected to an external power source providing an electrical pulse input, and an external magnetic field is applied to the device which is uniform and adjustable and is parallel to the two dimensional plane of the phase-change magnetic film 104. The magnetic field can be constrained in the size range of a specific device unit, and an intensity thereof is 0-12000 Oe. The magnetic head 106 is operable for detecting a magnetic state of the phase-change magnetic material, which is formed by a base 106A, two magnetic shield layers 106B and 106D, and a magnetoresistive sensor 106C. The magnetic shield layers 106B and 106D and the magnetoresistive sensor 106C are produced on the base 106A. The magnetic shield layers 106B and 106D are operable for shielding magnetic state of surrounding devices' interference with the magnetoresistive sensor 106C when the magnetic head 106 detecting a magnetic state of a certain device, and the magnetoresistive sensor 106C is operable for detecting residual magnetization of the phase-change magnetic material and converting the residual magnetization to a read current for outputting.

The phase-change magnetic film 104 is formed by doping a phase-change material with ferromagnetic elements, and is expressed by $A_xB_{1-x}$, where A is ferromagnetic element, B is phase-change material, and $0<x\leq30\%$. Phase-change material B is one of binary chalcogenides, ternary chalcogenides and quaternary chalcogenides including Ge—Te, Sb—Te, Bi—Te, Ge—Sb, Sn—Te, Sb—Se, In—Se, Ge—Sb—Te, In—Sb—Te, As—Sb—Te, Sn—Sb—Te, Ge—Te—Sn, Sb—Se—Bi, Ga—Te—Se, Ge—Te—Ti, Ge—Te—Sn—O, Ge—Te—Sn—Ag and Ag—In—Sb—Te, or an alloy thereof. Common stoichiometric materials include but are not limited to $Ge_2Sb_2Te_5$, $Ge_1Sb_2Te_4$, $Ge_1Sb_4Te_7$, GeTe, GeSb, $Sb_2Te_3$, $Sb_{70}Te_{30}$, $Ag_5In_5Sb_{60}Te_{30}$, $Bi_2Te_3$ and $Sb_2Se_3$.

Ferromagnetic element A is one of Co, Fe and Ni, or one of alloys formed by at least one of Co, Fe and Ni including FePt, CoPt, CoFeB, TbFeCo, CoCrPtB and CoCrPtTa. A also may be one of Mn, Cr and rare earth elements Gd, Tb, Dy, Ho, Er and Tm.

Advantageously, the phase-change magnetic material is $Fe_{0.02}Ge_{0.98}Te$, $Fe_{0.08}Ge_{0.92}Te$, $Fe_{0.14}Ge_{0.86}Te$ or $Fe_{0.25}Ge_{0.75}Te$. The phase-change magnetic material shows excellent hysteresis characteristic at both amorphous state and crystalline state, and saturation magnetization, residual magnetization and coercive field thereof change greatly for different degrees of crystallization.

Figure 2:
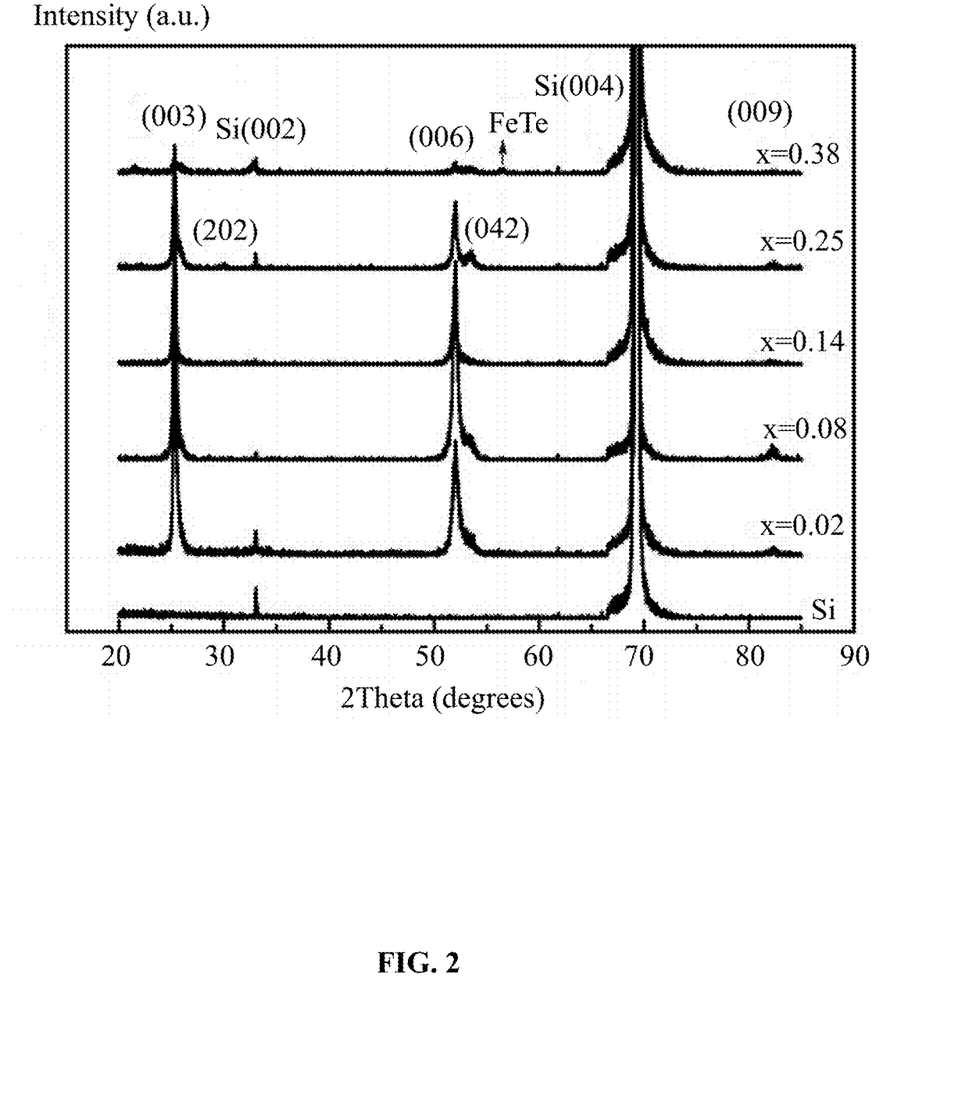
FIG. 2 is X-ray diffraction spectrogram of a series of phase-change magnetic materials $Fe_xGe_{1-x}Te$ according to one embodiment of the invention.

FIG. 2 is X-ray diffraction spectrogram of a series of phase-change magnetic materials $Fe_xGe_{1-x}Te$ according to one embodiment of the invention. The materials are deposited by pulsed laser with a substrate temperature of 300° C. Referring to FIG. 2, $Fe_xGe_{1-x}Te$ films are highly (001) oriented rhombohedral structures when x<0.38. Only diffraction peaks of base material GeTe appear in FIG. 2, which testifies that the film materials are single phased under the concentrations. When Fe concentration x increases to 0.25, GeTe crystal faces (202) and (042) of the rhombohedral structure appear, and when x reaches 0.38, a second phase FeTe appears and diffraction peak of base material GeTe becomes extremely weak for the second phase suppresses growth of GeTe grains. As the material is c-axis oriented, it can be assured that a small quantity of cells of the $Fe_xGe_{1-x}Te$ film swell along the c-axis with more Fe added thereto, which testifies that the added Fe reaches inside the lattice of base material GeTe.

Figure 3:
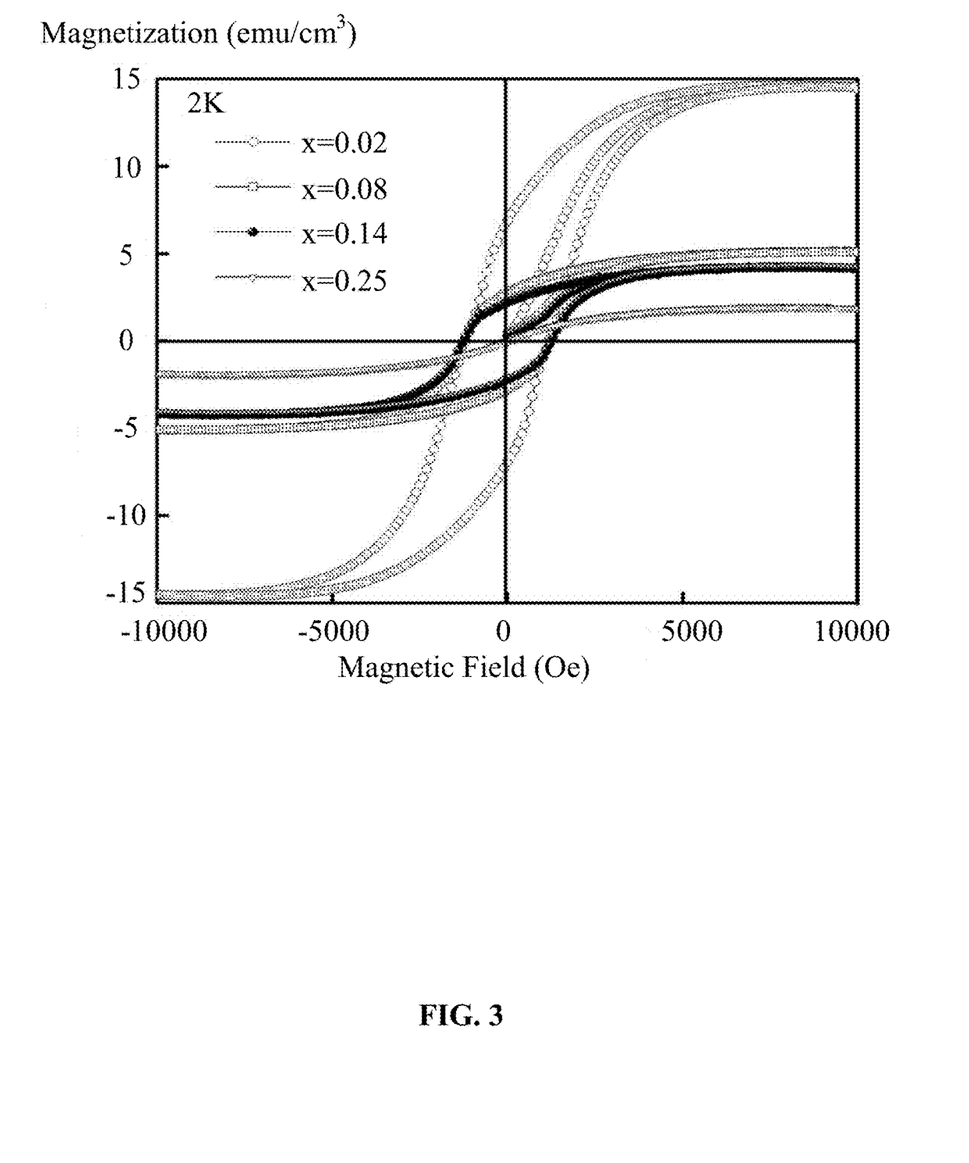
FIG. 3 is a magnetization curve of a series of phase-change magnetic films $Fe_xGe_{1-x}Te$ under a plane magnetic field of −10 kOe–10 kOe at 2 k according to one embodiment of the invention.

FIG. 3 is magnetization curve (M-H) of a series of phase-change magnetic films $Fe_xGe_{1-x}Te$ under a plane magnetic field of −10 kOe–10 kOe at 2 k according to one embodiment of the invention. Referring to FIG. 3, coercive fields of the hysteresis loops are above 1200 Oe with Fe concentration x increasing from 0.02 and 0.08 to 0.14, which means that ferromagnetic exchange interaction exists in the $Fe_xGe_{1-x}Te$ films. When Fe concentration x=0.02, both magnetization and residual magnetization of the whole film reach the maximum. Magnetizations and residual magnetizations of the films differentiate with different Fe concentrations while magnetic properties thereof change consistently with phase changes of the materials.

Figure 4A:
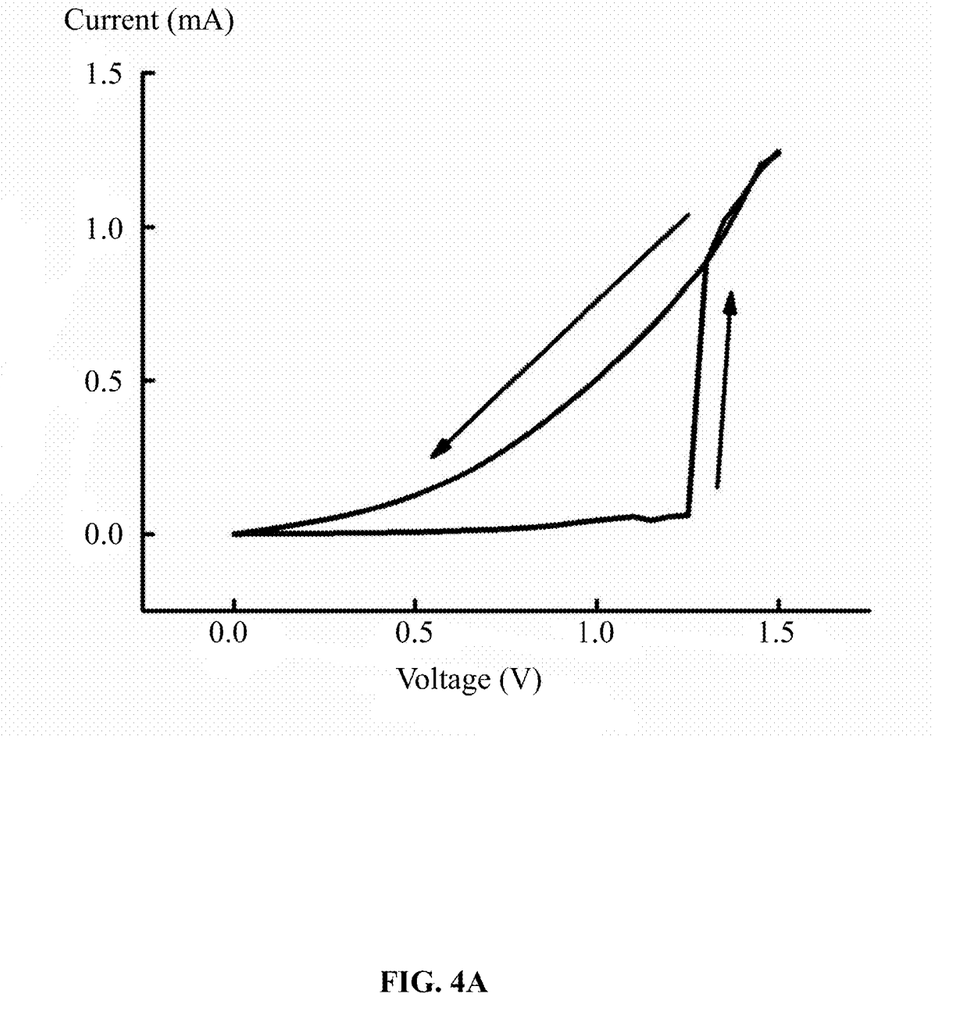
FIG. 4A is a typical I-V phase-change curve of a logic device based on phase-change magnetic materials according to one embodiment of the invention.

FIG. 4A is a typical I-V phase-change curve of a logic device based on phase-change magnetic material $Fe_{0.02}Ge_{0.98}Te$ according to one embodiment of the invention. Layers of the device are deposited at room temperature. Referring to FIG. 4A, the device is at amorphous state of high-impedance originally and changes to crystalline state of low-impedance when a voltage applied thereto exceeds a threshold thereof. Both amorphous state of high-impedance and crystalline state of low-impedance are non-volatile impedance states.

Figure 4B:
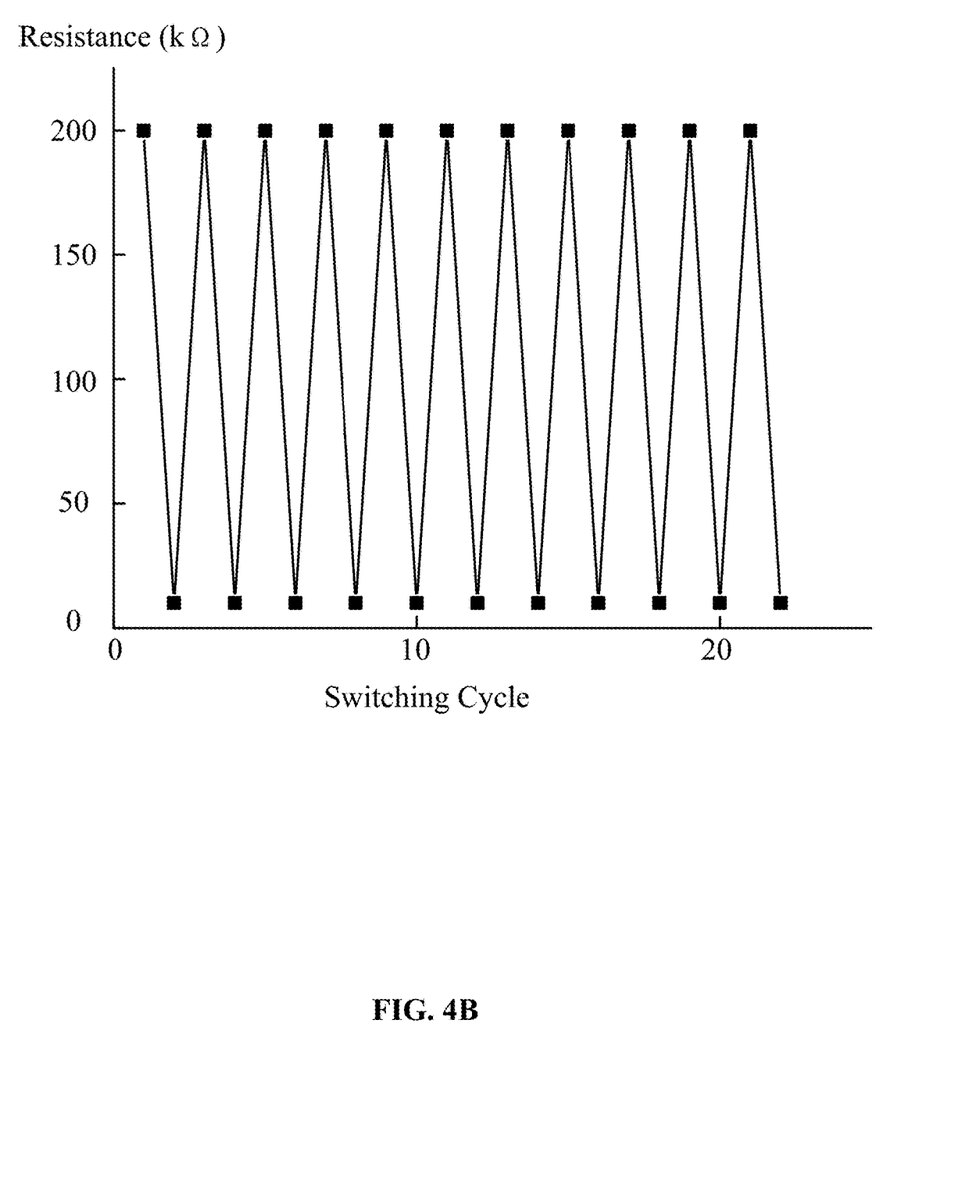
FIG. 4B shows typical phase-change property of a logic device based on phase-change magnetic materials in a pulse mode according to one embodiment of the invention.

FIG. 4B shows typical phase-change property of a logic device based on phase-change magnetic material $Fe_{0.02}Ge_{0.98}Te$ in pulse mode according to one embodiment of the invention. Referring to FIG. 4B, the device changes from high-impedance state to low-impedance state when a pulse SET with an amplitude of 0.8 V and a pulse width of 200 ns is applied thereto, and the device changes from low-impedance state to high-impedance state when a pulse RESET with an amplitude of 2 V and a pulse width of 30 ns is applied thereto.

Figure 5:
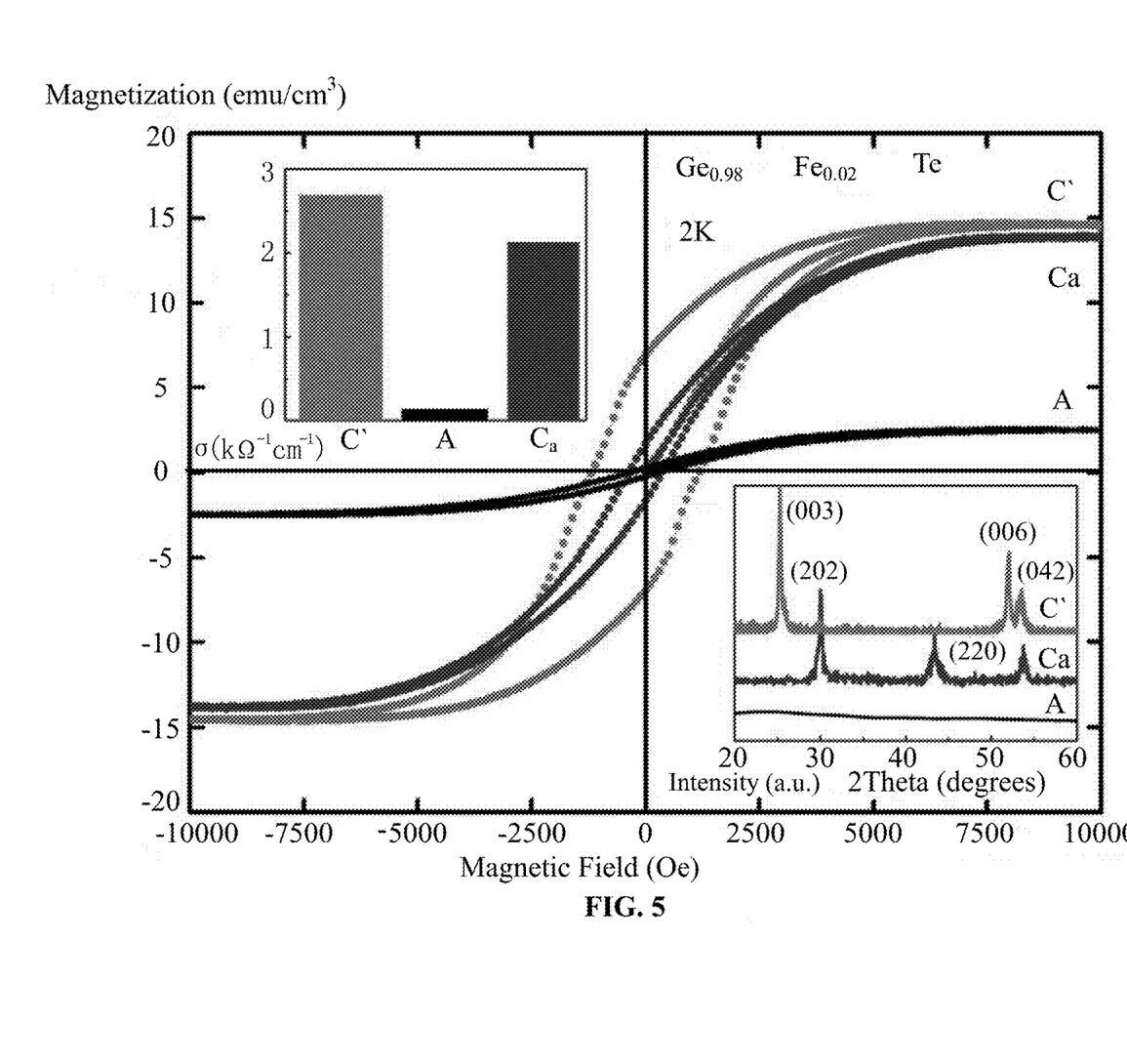
FIG. 5 shows phase-change controlled magnetic property of a logic device based on phase-change magnetic material $Fe_{0.02}Ge_{0.98}Te$ according to one embodiment of the invention.

FIG. 5 shows phase-change controlled magnetic property of a logic device based on phase-change magnetic material $Fe_{0.02}Ge_{0.98}Te$ according to one embodiment of the invention, where C represents a phase-change magnetic material sample at crystalline state deposited with a substrate temperature of 300° C., A represents a sample at amorphous state deposited at room temperature, $C_a$ represents a sample obtained by crystallization of the sample at amorphous state, the top left illustration shows conductance of the samples under the three film states, and the lower right illustration is X-ray diffraction spectrogram of the films under three different states. It can be inferred from FIG. 5 that each of the films C, A and $C_a$ under three different states has a hysteresis loop, which means that ferromagnetic exchange interaction between Fe ions exists in all the three phase structures. Saturation magnetization of amorphous sample A is merely 2.5 emu/cc, saturation magnetization of crystalline sample $C_a$ is 13.9 emu/cc, and saturation magnetization of crystalline sample C is very close to that of crystalline sample $C_a$, which is 14.9 emu/cc. Saturation magnetization changes among C, A and $C_a$ illustrate that magnetism of a film of phase-change magnetic material $Fe_{0.02}Ge_{0.98}Te$ changes with a phase structure thereof. Referring to FIG. 5, saturation magnetization and coercive field changes between samples C and $C_a$ of two different crystalline states are mainly caused by differences in crystallinity, which coincides with the result of XRD. Therefore, in a logic device based on phase-change material $Fe_{0.02}Ge_{0.98}Te$, magnetism of the material changes reversibly with phase changes caused by electrical pulses like conductance, and magnetism of the material can be regulated effectively by electro-induced phase change.

Table 1 is a truth table of implication (IMP) logic by a logic device based on phase-change magnetic materials according to one embodiment of the invention, which takes the advantage of differences in magnetic properties between an amorphous state and a crystalline state, namely, hysteresis loop of amorphous state is comparatively small, and crystalline state has obvious hysteresis with a comparatively great residual magnetization Br.

TABLE 1

IMP logic Output ← Input A IMP Input B

| input Input A (external electrical pulse) | input Input B (external magnetic field) | output Output (residual magnetization of the film) |
|---|---|---|
| 0 (RESET) | 0 (strong magnetic field) | 1 (weak residual magnetization) |
| 0 (RESET) | 1 (weak magnetic field) | 1 (weak residual magnetization) |
| 1 (SET) | 0 (strong magnetic field) | 0 (strong residual magnetization) |
| 1 (SET) | 1 (weak magnetic field) | 1 (weak residual magnetization) |

In Table 1, an external electrical pulse is Input A, a pulse SET is logic 1, a pulse RESET is logic 0, an external magnetic field is Input B, a weak magnetic field of 0-500 Oe (referring to 100 Oe in FIG. 5, where Oe is Oster, a unit of a magnetic field) is defined as logic 1 and a strong magnetic field of 2500-10000 Oe (referring to 5000 Oe in FIG. 5) is defined as logic 0. Logic output Output is residual magnetization Br of the phase-change magnetic material, which can be read by detecting residual magnetic state through magnetic head 106. Comparatively strong magnetization $B_r$ of 2.5 emu/cc-20 emu/cc is defined as logic output 0, and comparatively weak magnetization $B_r$ of 0-1 emu/cc is defined as logic output 1.

A reverse coercive field Hc or a pulse RESET could be applied to cause amorphization of the phase-change magnetic material to erase the stored information. According to the above principle, under the condition that the phase-change magnetic material is regulated to crystalline state by an applied pulse SET and a comparatively great external magnetic field is applied to make the material reach saturation magnetization, residual magnetization $B_r$ exists for the device. That is Output is 0 only when Input A is 1 and Input B is 0, which conforms to the truth table of IMP logic. When 0 and 1 of the logic input and the logic output are coded under different definition, the device can achieve more Boolean logic operations.

Table 2 is a truth table of Boolean logic OR by a logic device based on phase-change magnetic materials according to one embodiment of the invention.

TABLE 2

Boolean logic OR Output = Input A OR Input B

| input Input A (external electrical pulse) | input Input B (external magnetic field) | output Output (residual magnetization of the film) |
|---|---|---|
| 1 (RESET) | 0 (strong magnetic field) | 1 (weak residual magnetization) |
| 1 (RESET) | 1 (weak magnetic field) | 1 (weak residual magnetization) |

TABLE 2-continued

Boolean logic OR Output = Input A OR Input B

| input Input A (external electrical pulse) | input Input B (external magnetic field) | output Output (residual magnetization of the film) |
|---|---|---|
| 0 (SET) | 0 (strong magnetic field) | 0 (strong residual magnetization) |
| 0 (SET) | 1 (weak magnetic field) | 1 (weak residual magnetization) |

In Table 2, an external electrical pulse is Input A, a pulse RESET is logic 1, a pulse SET is logic 0, an external magnetic field is Input B, a weak magnetic field of 0-500 Oe is defined as logic 1 and a strong magnetic field of 2500-10000 Oe is defined as logic 0. Logic output Output is residual magnetization Br of the phase-change magnetic material, which can be read by detecting residual magnetic state through magnetic head 106. Comparatively strong magnetization $B_r$ of 2.5 emu/cc-20 emu/cc is defined as logic output 0, and comparatively weak magnetization $B_r$ of 0-1 emu/cc is defined as logic output 1.

Table 3 is a truth table of Boolean logic NOR by a logic device based on phase-change magnetic materials according to one embodiment of the invention.

TABLE 3

Boolean logic NOR Output = Input A NOR Input B

| input Input A (external electrical pulse) | input Input B (external magnetic field) | output Output (residual magnetization of the film) |
|---|---|---|
| 1 (RESET) | 0 (strong magnetic field) | 0 (weak residual magnetization) |
| 1 (RESET) | 1 (weak magnetic field) | 0 (weak residual magnetization) |
| 0 (SET) | 0 (strong magnetic field) | 1 (strong residual magnetization) |
| 0 (SET) | 1 (weak magnetic field) | 0 (weak residual magnetization) |

In Table 3, an external electrical pulse is Input A, a pulse RESET is logic 1, a pulse SET is logic 0, an external magnetic field is Input B, a weak magnetic field of 0-500 Oe is defined as logic 1 and a strong magnetic field of 2500-10000 Oe is defined as logic 0. Logic output Output is residual magnetization Br of the phase-change magnetic material, which can be read by detecting residual magnetic state through magnetic head 106. Comparatively strong magnetization $B_r$ of 2.5-20 emu/cc is defined as logic output 1, and comparatively weak magnetization $B_r$ of 0-1 emu/cc is defined as logic output 0.

Table 4 is a truth table of Boolean logic AND by a logic device based on phase-change magnetic materials according to one embodiment of the invention.

TABLE 4

Boolean logic AND Output = Input A AND Input B

| input Input A (external electrical pulse) | input Input B (external magnetic field) | output Output (residual magnetization of the film) |
|---|---|---|
| 0 (RESET) | 1 (strong magnetic field) | 0 (weak residual magnetization) |
| 0 (RESET) | 0 (weak magnetic field) | 0 (weak residual magnetization) |

TABLE 4-continued

Boolean logic AND Output = Input A AND Input B

| input Input A (external electrical pulse) | input Input B (external magnetic field) | output Output (residual magnetization of the film) |
|---|---|---|
| 1 (SET) | 1 (strong magnetic field) | 1 (strong residual magnetization) |
| 1 (SET) | 0 (weak magnetic field) | 0 (weak residual magnetization) |

In Table 4, an external electrical pulse is Input A, a pulse SET is logic 1, a pulse RESET is logic 0, an external magnetic field is Input B, a weak magnetic field of 0-500 Oe is defined as logic 0 and a strong magnetic field of 2500-10000 Oe is defined as logic 1. Logic output Output is residual magnetization Br of the phase-change magnetic material, which can be read by detecting residual magnetic state through magnetic head 106. Comparatively strong magnetization $B_r$ of 2.5-20 emu/cc is defined as logic output 1, and comparatively weak magnetization $B_r$ of 0-1 emu/cc is defined as logic output 0.

Table 5 is a truth table of Boolean logic NAND by a logic device based on phase-change magnetic materials according to one embodiment of the invention.

TABLE 5

Boolean logic NAND Output = Input A NAND Input B

| input Input A (external electrical pulse) | input Input B (external magnetic field) | output Output (residual magnetization of the film) |
|---|---|---|
| 0 (RESET) | 1 (strong magnetic field) | 1 (weak residual magnetization) |
| 0 (RESET) | 0 (weak magnetic field) | 1 (weak residual magnetization) |
| 1 (SET) | 1 (strong magnetic field) | 0 (strong residual magnetization) |
| 1 (SET) | 0 (weak magnetic field) | 1 (weak residual magnetization) |

In Table 5, an external electrical pulse is Input A, a pulse SET is logic 1, a pulse RESET is logic 0, an external magnetic field is Input B, a weak magnetic field of 0-500 Oe is defined as logic 0 and a strong magnetic field of 2500-10000 Oe is defined as logic 1. Logic output Output is residual magnetization Br of the phase-change magnetic material, which can be read by detecting residual magnetic state through magnetic head 106. Comparatively strong magnetization $B_r$ of 2.5-20 emu/cc is defined as logic output 0, and comparatively weak magnetization $B_r$ of 0-1 emu/cc is defined as logic output 1.

The logic device of the invention achieves logic operations based on stable and reversible phase change controlled magnetic properties thereof. Operation results can be directly stored as magnetic status of the material in the device non-volatilely so as to combine computation with storage in a single unit. By changing definitions of relationships between the input electrical pulse, the input magnetic field and residual magnetization output of the phase-change magnetic material and logics 0 and 1, five basic logic operations including IMP logic, OR logic, NOR logic, AND logic and NAND logic can be carried out parallel by a signal step which is convenient and highly efficient. More complex Boolean logic operations such as XOR logic and XNOR logic can be achieved base on the five basic logic operations of the invention, so as to achieve a complete set of Boolean logic operations. The invention can achieve a plurality of logic operations by a single device, and logics 0 and 1 can be defined by required logic functions flexibly in practice, which can greatly promote design and application of non-volatile logic devices.

Unless otherwise indicated, the numerical ranges involved in the invention include the end values.

While preferred embodiments of the invention have been described above, the invention is not limited to disclosure in the embodiments and the accompanying drawings. Any changes or modifications without departing from the spirit of the invention fall within the scope of the invention.

The invention claimed is:

1. A non-volatile logic operation method by using a non-volatile logic device, the non-volatile logic device comprising a top electrode, an active layer, and a phase-change magnetic film, the phase-change magnetic film comprising a top surface, the non-volatile logic operation method comprising:

1) applying an electrical pulse signal to the top electrode and the active layer and applying an external magnetic field on the phase-change magnetic film, wherein the external magnetic field is substantially parallel to the top surface of the phase-change magnetic film; and 2) carrying out logic operation by using the electrical pulse signal as a logic input Input A, using the external magnetic field as another logic input Input B, and using residual magnetization Br of the phase-change magnetic film as logic output Output.

2. The method of claim 1, wherein
for the logic input Input A, an electrical pulse signal SET is defined as logic 1, and an electrical pulse signal RESET is defined as logic 0;
for the logic input Input B, a weak magnetic field of 0-500 Oe is defined as logic 1, and a strong magnetic field of 2500 Oe-10000 Oe is defined as logic 0; and
for the logic output Output, comparatively strong magnetization Br of 2.5 emu/cc-20 emu/cc is defined as logic output 0, and comparatively weak magnetization Br of 0-1 emu/cc is defined as logic output 1, to achieve implication logic operation.

3. The method of claim 1, wherein
for the logic input Input A, an electrical pulse signal SET is defined as logic 0, and an electrical pulse signal RESET is defined as logic 1;
for the logic input Input B, a weak magnetic field of 0-500 Oe is defined as logic 1, and a strong magnetic field of 2500 Oe-10000 Oe is defined as logic 0; and
for logic output Output, comparatively strong magnetization Br of 2.5 emu/cc-20 emu/cc is defined as logic output 0, and comparatively weak magnetization Br of 0-1 emu/cc is defined as logic output 1, to achieve Boolean logic OR operation.

4. The method of claim 1, wherein
for the logic input Input A, an electrical pulse signal SET is defined as logic 0, and an electrical pulse signal RESET is defined as logic 1;
for the logic input Input B, a weak magnetic field of 0-500 Oe is defined as logic 1, and a strong magnetic field of 2500 Oe-10000 Oe is defined as logic 0; and
for logic output Output, comparatively strong magnetization Br of 2.5 emu/cc-20 emu/cc is defined as logic output 1, and comparatively weak magnetization Br of 0-1 emu/cc is defined as logic output 0, to achieve Boolean logic NOR operation.

5. The method of claim 1, wherein
for logic input Input A, an electrical pulse signal SET is defined as logic 1, and an electrical pulse signal RESET is defined as logic 0;
for logic input Input B, a weak magnetic field of 0-500 Oe is defined as logic 0, and a strong magnetic field of 2500 Oe-10000 Oe is defined as logic 1; and
for logic output Output, comparatively strong magnetization Br of 2.5 emu/cc-20 emu/cc is defined as logic output 1, and comparatively weak magnetization Br of 0-1 emu/cc is defined as logic output 0, so as to realize Boolean logic AND operation.

6. The method of claim 1, wherein
for the logic input Input A, an electrical pulse signal SET is defined as logic 1, and an electrical pulse signal RESET is defined as logic 0;
for the logic input Input B, a weak magnetic field of 0-500 Oe is defined as logic 0, and a strong magnetic field of 2500 Oe-10000 Oe is defined as logic 1; and
for logic output Output, comparatively strong magnetization Br of 2.5 emu/cc-20 emu/cc is defined as logic output 0, and comparatively weak magnetization Br of 0-1 emu/cc is defined as logic output 1, to achieve Boolean logic NAND operation.

\* \* \* \* \*